US012724342B2

(12) United States Patent
Seong et al.

(10) Patent No.: US 12,724,342 B2
(45) Date of Patent: Sep. 1, 2026

(54) SEMICONDUCTOR PHOTORESIST COMPOSITIONS AND METHODS OF FORMING PATTERNS USING THE COMPOSITION

(71) Applicant: SAMSUNG SDI CO., LTD., Yongin-si (KR)

(72) Inventors: Taegeun Seong, Suwon-si (KR); Sumin Jang, Suwon-si (KR); Seol Hee Lim, Suwon-si (KR); Eunmi Kang, Suwon-si (KR); Yaeun Seo, Suwon-si (KR); Seung-Wook Shin, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 18/974,235

(22) Filed: Dec. 9, 2024

(65) Prior Publication Data

US 2025/0264798 A1 Aug. 21, 2025

(30) Foreign Application Priority Data

Feb. 15, 2024 (KR) ........................ 10-2024-0022098

(51) Int. Cl.
*G03F 7/004* (2006.01)
*G03F 7/031* (2006.01)

(52) U.S. Cl.
CPC ............ *G03F 7/0044* (2013.01); *G03F 7/031* (2013.01)

(58) Field of Classification Search
CPC ........................................................ G03F 7/03
See application file for complete search history.

(56) References Cited

U.S. PATENT DOCUMENTS

| | | | |
|---|---|---|---|
| 5,061,599 A | 10/1991 | Kudo et al. | |
| 12,013,635 B2 * | 6/2024 | Moon | G03F 7/0042 |
| 2003/0031958 A1 | 2/2003 | Tohge et al. | |
| 2004/0118696 A1 | 6/2004 | Zhang et al. | |
| 2004/0202956 A1 | 10/2004 | Takahashi et al. | |
| 2005/0266341 A1 | 12/2005 | Kim et al. | |
| 2011/0045406 A1 | 2/2011 | Keszler et al. | |
| 2013/0224652 A1 | 8/2013 | Bass et al. | |
| 2017/0052449 A1 | 2/2017 | Nakagawa et al. | |
| 2019/0308998 A1 | 10/2019 | Cardineau et al. | |
| 2019/0315781 A1 | 10/2019 | Edson et al. | |
| 2020/0041898 A1 | 2/2020 | Nakagawa et al. | |
| 2020/0326627 A1 | 10/2020 | Jiang et al. | |
| 2020/0388413 A1 | 12/2020 | Kushida et al. | |
| 2021/0347791 A1 | 11/2021 | Cardineau et al. | |
| 2021/0356861 A1 | 11/2021 | Han et al. | |
| 2021/0380612 A1 | 12/2021 | Koh et al. | |
| 2022/0197138 A1 * | 6/2022 | Moon | G03F 7/0042 |
| 2023/0143592 A1 | 5/2023 | Jiang et al. | |
| 2023/0223262 A1 | 7/2023 | Moon et al. | |
| 2023/0314946 A1 | 10/2023 | Hansen et al. | |
| 2023/0384669 A1 | 11/2023 | Weng et al. | |
| 2025/0199400 A1 | 6/2025 | Moon | |
| 2025/0208510 A1 | 6/2025 | Iwamori et al. | |

FOREIGN PATENT DOCUMENTS

| | | |
|---|---|---|
| CN | 102650826 A | 8/2012 |
| CN | 115050633 A | 9/2022 |
| CN | 116947914 A | 10/2023 |
| JP | 2003-15277 A | 1/2003 |
| JP | 2005-11584 A | 1/2005 |
| JP | 2007-507743 A | 3/2007 |
| JP | 2017-506361 A | 3/2017 |
| JP | 2021-528676 A | 10/2021 |
| JP | 2021-179606 A | 11/2021 |
| JP | 2022-032981 A | 2/2022 |
| JP | 2022-526031 A | 5/2022 |
| JP | 2022-97388 A | 6/2022 |
| JP | 2023-529344 A | 7/2023 |
| JP | 2025-99887 A | 7/2025 |
| KR | 10-2004-0024523 A | 3/2004 |
| KR | 10-2004-0091964 A | 11/2004 |
| KR | 10-2014-0121826 A | 10/2014 |
| KR | 10-2017-0022945 A | 3/2017 |
| KR | 10-2017-0132726 A | 12/2017 |
| KR | 10-2018-0029058 A | 3/2018 |
| KR | 10-2019-0129916 A | 11/2019 |
| KR | 10-2020-0078518 A | 7/2020 |
| KR | 10-2021-0138416 | 11/2021 |

(Continued)

OTHER PUBLICATIONS

Anderson, C. N.: Baclea-An, L-M.; Denham, P.; George, S.; Goldberg, K.A. ; Jones, M. S. Smith, S.S.; Wallow, T. I.; Montgomery, M. W. ; Naulleau, P., Proc. SPIE 7969, 7960R (2011.

H. Okamoto, T. Iwayanagi, K. Mochiji, H. Umezaki, T. Kudo, Applied Physics Letters, 49(5), 298-300, 1986.

J. K. Stowers, A. Telecky, M. Kocsis, B.L. Clark, D. A. Keszler, A. Greenville, C. N. Anderson, P. P. Naulleau, Proc. SPIE, 7969, 796915, 2011.

Taiwanese Office Action corresponding to TW Application No. 113148554, dated May 9, 2025 (6 pages).

Taiwanese Office Action corresponding to TW Application No. 113148997, dated Sep. 12, 2025 (6 pages).

(Continued)

*Primary Examiner* — Chanceity N Robinson
(74) *Attorney, Agent, or Firm* — Womble Bond Dickinson (US) LLP

(57) ABSTRACT

A semiconductor photoresist composition includes a Sn-containing organometallic compound; a compound represented by Chemical Formula 1; and a solvent. A method of forming patterns using the semiconductor photoresist composition includes: providing an etching-objective layer on a substrate; coating the semiconductor photoresist composition on the etching-objective layer to form a photoresist layer; patterning the photoresist layer to form a photoresist pattern; and etching the etching-objective layer using the photoresist pattern as an etching mask.

10 Claims, 5 Drawing Sheets

(56) References Cited

FOREIGN PATENT DOCUMENTS

| | | | |
|---|---|---|---|
| KR | 10-2021-0152291 | A | 12/2021 |
| KR | 10-2022-0035750 | A | 3/2022 |
| KR | 10-2022-0088013 | A | 6/2022 |
| KR | 10-2023-0023410 | A | 2/2023 |
| KR | 10-2518770 | B1 | 4/2023 |
| TW | 201708307 | A | 3/2017 |
| TW | 202217459 | A | 5/2022 |
| TW | 202225178 | A | 7/2022 |
| TW | 202225179 | A | 7/2022 |
| TW | 202317593 | A | 5/2023 |
| TW | 202323261 | A | 6/2023 |
| WO | 2002/083764 | A1 | 10/2002 |

OTHER PUBLICATIONS

Japanese Office Action corresponding to JP Application No. 2024-228095, dated Oct. 17, 2025 (4 pages).

Japanese Office Action corresponding to JP Application No. 2024-217493, dated Nov. 13, 2025 (4 pages).

* cited by examiner

SEMICONDUCTOR PHOTORESIST COMPOSITIONS AND METHODS OF FORMING PATTERNS USING THE COMPOSITION

CROSS-REFERENCE TO RELATED APPLICATION

The present application claims priority to and the benefit of Korean Patent Application No. 10-2024-0022098, filed on Feb. 15, 2024, in the Korean Intellectual Property Office, the entire content of which is hereby incorporated herein by reference.

BACKGROUND

1. Field

Embodiments of this disclosure relate to semiconductor photoresist compositions and methods of forming patterns using the same.

2. Description of the Related Art

EUV (extreme ultraviolet) lithography is paid attention to as one technology for manufacturing a next generation semiconductor device. EUV lithography is a pattern-forming technology using an EUV ray having a wavelength of 13.5 nm as an exposure light source. According to EUV lithography, an extremely fine pattern (e.g., less than or equal to 20 nm) may be formed in an exposure process during a manufacture of a semiconductor device.

Extreme ultraviolet (EUV) lithography is being realized through development of compatible photoresists which can be performed at a spatial resolution of less than or equal to 16 nm. Currently, efforts to satisfy insufficient specifications of chemically amplified (CA) photoresists such as a resolution, a photospeed, and feature roughness (which may also be referred to as a line edge roughness or LER) for next generation devices are being made.

An intrinsic image blurring due to an acid catalyzed reaction in these polymer-type photoresists limits a resolution in small feature sizes, which has been present in electron beam (e-beam) lithography for a long time. Chemically amplified (CA) photoresists are designed for high sensitivity, but because their elemental makeups reduce light absorbance of the photoresists at a wavelength of 13.5 nm and thus decrease their sensitivity, chemically amplified (CA) photoresists may partially have more difficulties under an EUV exposure.

CA photoresists may have difficulties in the small feature sizes due to roughness issues, and line edge roughness (LER) of the CA photoresists experimentally turns out to be increased, as a photospeed is decreased partially due to an essence of acid catalyst processes. Accordingly, a novel high-performance photoresist is desired in a semiconductor industry because of these defects and problems of CA photoresists.

In order to overcome the aforementioned drawbacks of chemically amplified (CA) organic photosensitive composition, an inorganic photosensitive composition has been researched. The inorganic photosensitive composition is mainly used for negative tone patterning having resistance against removal by a developer composition due to chemical modification through nonchemical amplification mechanism. The inorganic composition contains an inorganic element having a higher EUV absorption rate than hydrocarbon and thus may secure sensitivity through a nonchemical amplification mechanism and in addition, is less sensitive with respect to a stochastic effect and thus has low line edge roughness and a relatively smaller number of defects.

Inorganic photoresists based on peroxopolyacids of tungsten mixed together with tungsten, niobium, titanium, and/or tantalum have been reported as radiation sensitive materials for patterning.

These materials are effective for patterning large pitches for bilayer configuration as far ultraviolet (deep UV), X-ray, and electron beam sources. More recently, if cationic hafnium metal oxide sulfate ($HfSO_x$) materials along with a peroxo complexing agent has been used to image a 15 nm half-pitch (HP) through projection EUV exposure, impressive performance has been obtained. This system exhibits the highest performance of a non-CA photoresist and has a practicable photospeed near to a suitable level for an EUV photoresist. However, the hafnium metal oxide sulfate material having the peroxo complexing agent has a few practical drawbacks. First, these materials are coated in a mixture of corrosive sulfuric acid/hydrogen peroxide and have insufficient shelf-life stability. Second, a structural change thereof for performance improvement as a composite mixture is not easy. Third, development should be performed in a TMAH (tetramethylammonium hydroxide) solution at an extremely high concentration of 25 wt % and/or the like.

Recently, active research has been conducted into molecules containing tin that have excellent absorption of extreme ultraviolet rays. As for an organotin polymer among them, alkyl ligands are dissociated by light absorption or secondary electrons produced thereby, and are crosslinked with adjacent chains through oxo bonds and thus enable the negative tone patterning which may not be removed by an organic developer. This organotin polymer exhibits greatly improved sensitivity as well as maintains a resolution and line edge roughness, but the patterning characteristics should be additionally improved for commercial availability.

SUMMARY

Some embodiments of the present disclosure provide a semiconductor photoresist composition having excellent sensitivity characteristics and exposure latitude (EL) characteristics.

Some embodiments provide a method of forming patterns using the semiconductor photoresist composition.

A semiconductor photoresist composition according to some embodiments includes a tin (Sn)-containing organometallic compound; a compound represented by Chemical Formula 1; and a solvent.

The method of forming patterns according to some embodiments includes providing an etching-objective layer on a substrate, coating the semiconductor photoresist composition on the etching-objective layer to form a photoresist layer, patterning the photoresist layer to form a photoresist pattern, and etching the etching-objective layer using the photoresist pattern as an etching mask.

The semiconductor photoresist composition according to some embodiments can implement excellent sensitivity and exposure latitude (EL) characteristics.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1A:
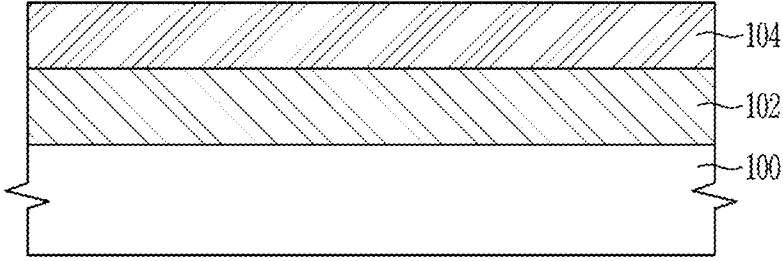
FIGS. 1A-1E are cross-sectional views illustrating a method of forming patterns using a semiconductor photoresist composition according to some embodiments of the present disclosure.

Hereinafter, referring to the drawings, embodiments are described in more detail. In the following description of the present disclosure, certain functions and/or constructions may not be described in order to clarify the subject matter of the present disclosure.

In order to clearly illustrate the subject matter of the present disclosure, certain description and relationships may be omitted, and throughout the disclosure, the same or similar configuration elements are designated by the same reference numerals. Also, because the size and thickness of each configuration shown in the drawing may be arbitrarily shown for better understanding and ease of description, the present disclosure is not necessarily limited thereto.

In the drawings, the thickness of layers, films, panels, regions, etc., may be enlarged for clarity. In the drawings, the thickness of a part of layers or regions, etc., may be exaggerated for clarity. It will be understood that if an element such as a layer, film, region, or substrate is referred to as being "on" another element, it can be directly on the other element or intervening elements may also be present.

As used herein, "substituted" refers to replacement of a hydrogen atom by deuterium, a halogen, a hydroxy group, a thiol group, a cyano group, a nitro group, —NRR' (wherein, R and R' are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein, R, R', and R" are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, a substituted or unsubstituted C6 to C30 aromatic hydrocarbon group), a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, a C1 to C20 sulfide group, or a combination thereof. "Unsubstituted" refers to non-replacement of a hydrogen atom by another substituent and remaining of the hydrogen atom.

As used herein, if a definition is not otherwise provided, "alkyl group" refers to a linear or branched aliphatic hydrocarbon group. The alkyl group may be a "saturated alkyl group" without any double bond or triple bond.

The alkyl group may be a C1 to C8 alkyl group. For example, the alkyl group may be a C1 to C7 alkyl group, a C1 to C6 alkyl group, or a C1 to C5 alkyl group. For example, the C1 to C5 alkyl group may be a methyl group, an ethyl group, a propyl group, an isopropyl group, an n-butyl group, an isobutyl group, a sec-butyl group, a tert-butyl group, or a 2,2-dimethylpropyl group.

As used herein, if a definition is not otherwise provided, "cycloalkyl group" refers to a monovalent cyclic aliphatic hydrocarbon group.

The cycloalkyl group may be a C3 to C8 cycloalkyl group, a C3 to C7 cycloalkyl group, or a C3 to C6 cycloalkyl group. For example, the cycloalkyl group may be a cyclopropyl group, a cyclobutyl group, a cyclopentyl group, or a cyclohexyl group, but is not limited thereto.

As used herein, "aliphatic unsaturated organic group" refers to a hydrocarbon group including a bond in which the bond between the carbon and carbon atom in the molecule is a double bond, a triple bond, or a combination thereof.

The aliphatic unsaturated organic group may be a C2 to C8 aliphatic unsaturated organic group. For example, the aliphatic unsaturated organic group may be a C2 to C7 aliphatic unsaturated organic group, a C2 to C6 aliphatic unsaturated organic group, a C2 to C5 aliphatic unsaturated organic group, or a C2 to C4 aliphatic unsaturated organic group. For example, the C2 to C4 aliphatic unsaturated organic group may be a vinyl group, an ethynyl group, an allyl group, a 1-propenyl group, a 1-methyl-1-propenyl group, a 2-propenyl group, a 2-methyl-2-propenyl group, a 1-propynyl group, a 1-methyl-1 propynyl group, a 2-propynyl group, a 2-methyl-2-propynyl group, a 1-butenyl group, a 2-butenyl group, a 3-butenyl group, a 1-butynyl group, a 2-butynyl group, or a 3-butynyl group.

As used herein, "aryl group" refers to a substituent in which all atoms in the cyclic substituent have a p-orbital and these p-orbitals are conjugated and may include a monocyclic, polycyclic, or fused ring (e.g., rings sharing adjacent pairs of carbon atoms) functional group.

As used herein, "heteroaryl group" may refer to an aryl group including at least one heteroatom selected from N, O, S, P, and Si. Two or more heteroaryl groups are linked by a sigma bond directly, or if the heteroaryl group includes two or more rings, the two or more rings may be fused together. If the heteroaryl group is a fused ring, each ring may include one to three heteroatoms.

As used herein, unless otherwise defined, "alkenyl group" refers to an aliphatic unsaturated alkenyl group including at least one double bond as a linear or branched aliphatic hydrocarbon group.

As used herein, unless otherwise defined, "alkynyl group" refers to an aliphatic unsaturated alkynyl group including at least one triple bond as a linear or branched aliphatic hydrocarbon group.

Hereinafter, a semiconductor photoresist composition according to some embodiments is described.

The semiconductor photoresist composition according to some embodiments includes a tin (Sn)-containing organometallic compound, a compound represented by Chemical Formula 1; and a solvent.

Chemical Formula 1

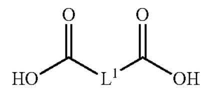

In Chemical Formula 1, $L^1$ is a single bond (e.g., a single covalent bond) or a substituted or unsubstituted C1 to C10 alkylene group, and $R^1$ is a substituted or unsubstituted C2 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C30 arylalkyl group, $-L^a-X^1-R^a$ (wherein $X^1$ is O or S, $L^a$ is a single bond (e.g., a single covalent bond) or a substituted or unsubstituted C1 to C20 alkylene group, and $R^a$ is a substituted or unsubstituted C1 to C20 alkyl group or a substituted or unsubstituted C6 to C30 aryl group), or $-L^b-N(R^b)(R^c)$ (wherein, $L^b$ is a single bond (e.g., a single covalent bond) or a substituted or unsubstituted C1 to C20 alkylene group, and $R^b$ and $R^c$ are each independently hydrogen or a substituted or unsubstituted C1 to C20 alkyl group).

The semiconductor photoresist composition has improved sensitivity and LER and excellent resolution by including a branched-carboxylic acid-based compound having a hydroxyl functional group.

In embodiments, if $R^1$ is an alkyl group, exposure latitude (EL) characteristics may be further improved by including a carbon chain having two or more carbon atoms.

For example, $R^1$ may be a substituted or unsubstituted C2 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C30 arylalkyl group, or $-L^a-X^1—R^a$ (wherein $X^1$ is O or S, $L^a$ is a single bond or a substituted or unsubstituted C1 to C20 alkylene group, and $R^a$ is a substituted or unsubstituted C1 to C20 alkyl group or a substituted or unsubstituted C6 to C30 aryl group).

As an example, $R^1$ may be an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, or a propoxy group.

As an example, the compound represented by Chemical Formula 1 may be one selected from the compounds listed in Group 1.

Group 1

Chemical Formula 8

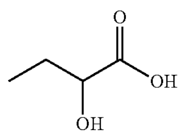

Chemical Formula 9

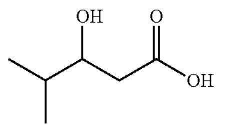

Chemical Formula 10

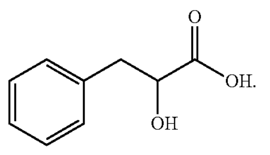

The compound represented by Chemical Formula 1 may be included in an amount of about 0.01 wt % to about 10 wt % based on 100 wt % of the semiconductor photoresist composition.

For example, the compound represented by Chemical Formula 1 may be included in an amount of about 0.01 wt % to about 5 wt % or about 0.05 wt % to about 5 wt % based on 100 wt % of the semiconductor photoresist composition.

The Sn-containing organometallic compound may be included in an amount of about 0.5 wt % to about 30 wt % based on 100 wt % of the semiconductor photoresist composition.

The semiconductor photoresist composition according to some embodiments may improve the sensitivity of the photoresist by including the Sn-containing organometallic compound and the compound represented by Chemical Formula 1 within the above content ranges.

The semiconductor photoresist composition according to some embodiments may include the Sn-containing organometallic compound and the compound represented by Chemical Formula 1 in a weight ratio of about 99.9:0.1 to about 80:20. For example, the semiconductor photoresist composition may include the Sn-containing organometallic compound and the compound represented by Chemical Formula 1 in a weight ratio of about 95:5 to about 85:15.

If the weight ratio of the Sn-containing organometallic compound and the compound represented by Chemical Formula 1 satisfies the above ranges, a semiconductor photoresist composition having excellent sensitivity can be provided.

The Sn-containing organometallic compound may include at least one selected from an organic oxy group and an organic carbonyloxy group.

The Sn-containing organometallic compound may be represented by Chemical Formula 2.

Chemical Formula 2

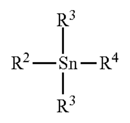

In Chemical Formula 2, $R^2$ is selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, and a substituted or unsubstituted C7 to C30 arylalkyl group, $R^3$ to $R^5$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C30 arylalkyl group, alkoxy and aryloxy ($—OR^d$, wherein $R^d$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), a carboxyl group ($—O(CO)R^e$, wherein $R^e$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), alkylamido or dialkylamido ($—NR^fR^g$, wherein $R^f$ and $R^g$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), amidato (—$NR^h(COR^i)$, wherein $R^h$ and $R^i$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), amidinato (—$NR^jC(NR^k)R^l$, wherein $R^j$, $R^k$, and $R^l$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), alkylthio and arylthiol (—$SR^m$, wherein $R^m$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), or a thiocarboxyl group (—$S(CO)R^n$, $R^n$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), and at least one selected from $R^3$ to $R^5$ is selected from alkoxy and aryloxy (—$OR^d$, wherein $R^d$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), a carboxyl group (—$O(C{=}O)$ $R^e$, wherein $R^e$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), alkylamido or dialkylamido (—$NR^fR^g$, wherein $R^f$ and $R^g$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), amidato (—$NR^h$ $(C{=}OR^i)$, wherein $R^h$ and $R^i$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), amidinato (—$NR^jC(NR^k)R^l$, wherein $R^j$, $R^k$, and $R^l$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), alkylthio and arylthiol (—$SR^m$, wherein $R^m$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), and a thiocarboxyl group (—$S(C{=}O)R^n$, wherein $R^n$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof).

In some embodiments, at least one selected from $R^3$ to $R^5$ may be selected from alkoxy and aryloxy (—$OR^d$, wherein $R^d$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof), and a carboxyl group (—$O(C{=}O)R^e$, wherein $R^e$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof).

In embodiments, the compound represented by Chemical Formula 2 includes —$OR^d$ or —$OC({=}O)R^e$ as a ligand, so that a pattern formed using a semiconductor photoresist composition including the same can exhibit excellent limiting resolution.

In embodiments, the —$OR^d$ or —$OC({=}O)R^e$ ligand can determine the solubility of the compound represented by Chemical Formula 2 in a solvent.

$R^2$ may be a substituted or unsubstituted C1 to C8 alkyl group, a substituted or unsubstituted C3 to C8 cycloalkyl group, a substituted or unsubstituted C2 to C8 aliphatic unsaturated organic group including one or more double bonds and/or triple bonds, a substituted or unsubstituted C6 to C20 aryl group, a substituted or unsubstituted C4 to C20 heteroaryl group, a carbonyl group, an ethoxy group, a propoxy group, or a combination thereof, $R^d$ may be a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, and $R^e$ may be hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof.

$R^2$ may be a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, a formyl group, an acetyl group, a propanoyl group, a butanoyl group, a pentanoyl group, an ethoxy group, a propoxy group, or a combination thereof, $R^d$ may be an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof, and $R^e$ may be hydrogen, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

In embodiments, the Sn-containing organometallic compound may be represented by Chemical Formula 3 or Chemical Formula 4.

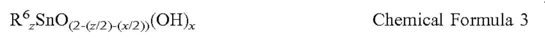

$R^6_zSnO_{(2-(z/2)-(x/2))}(OH)_x$ Chemical Formula 3

In Chemical Formula 3, $R^6$ is a C1 to C31 hydrocarbyl group, $0<z\leq 2$, and $0<(z+x)\leq 4$;

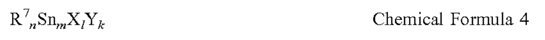

$R^7_nSn_mX_lY_k$ Chemical Formula 4 wherein, in Chemical Formula 4, $R^7$ is a substituted or unsubstituted C1 to C20 alkyl group, a substituted or unsubstituted C3 to C20 cycloalkyl group, a substituted or unsubstituted C2 to C20 bonds, a substituted or unsubstituted C6 to C30 aryl group, a substituted or unsubstituted C4 to C30 heteroaryl group, a carbonyl group, an ethylene oxide group, a propylene oxide group, or a combination thereof, X is sulfur(S), selenium (Se), or tellurium (Te), Y is —$OR^o$ or —$OC(=O)R^p$, wherein $R^o$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $R^p$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and n, m, l, and k are each independently an integer of 1 to 20.

The solvent of the semiconductor photoresist composition according to some embodiments may be an organic solvent, and may be for example aromatic compounds (e.g., xylene, toluene, etc.), alcohols (e.g., 4-methyl-2-pentenol, 4-methyl-2-propanol, 1-butanol, methanol, isopropyl alcohol, 1-propanol, etc.), ethers (e.g., anisole, tetrahydrofuran, etc.), esters (n-butyl acetate, propylene glycol monomethyl ether acetate, ethyl acetate, ethyl lactate, etc.), ketones (e.g., methyl ethyl ketone, 2-heptanone, etc.), or a mixture thereof, but is not limited thereto.

The semiconductor photoresist composition according to some embodiments may further include a resin in addition to the aforementioned Sn-containing organometallic compound, compound represented by Chemical Formula 1, and a solvent.

The resin may be a phenol-based resin including at least one aromatic moiety of Group 2.

Group 2

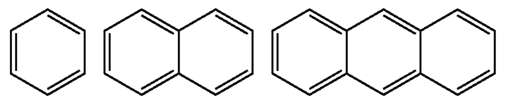

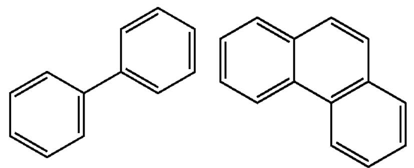

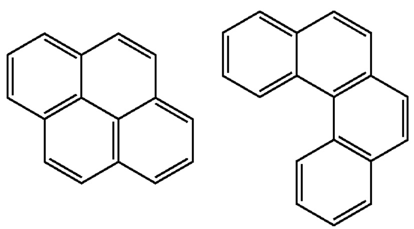

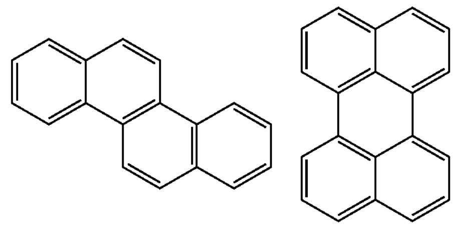

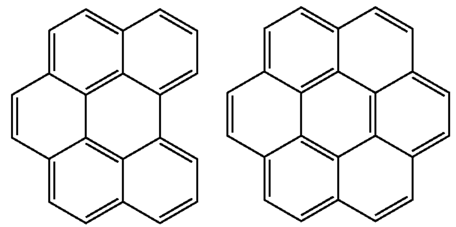

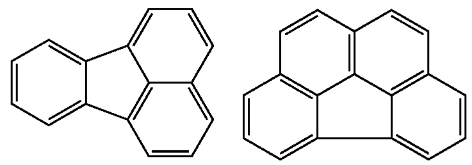

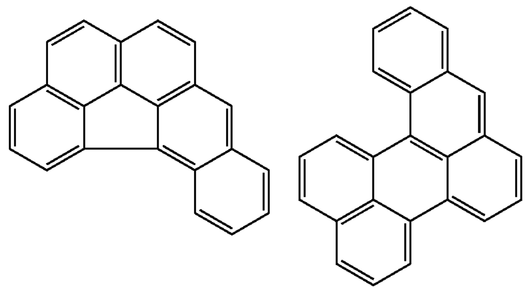

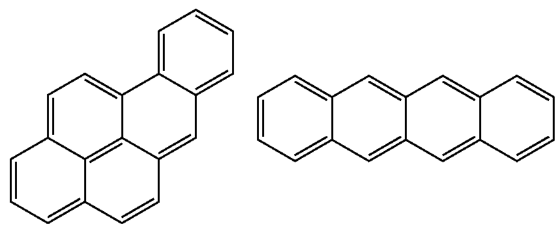

-continued

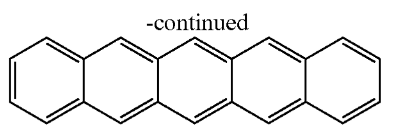

The resin may have a weight average molecular weight of about 500 to about 20,000.

The resin may be included in an amount of about 0.1 wt % to about 50 wt % based on a total amount of the semiconductor photoresist composition.

If the resin is included in the above content range, it may have excellent etch resistance and heat resistance.

In embodiments, the semiconductor photoresist composition according to some embodiments may consist of the aforementioned Sn-containing organometallic compound, the compound represented by Chemical Formula 1, the solvent, and the resin.

However, the semiconductor photoresist composition according to the aforementioned embodiments may further include additives as needed or desired. Examples of the additives may be a surfactant, a crosslinking agent, a leveling agent, an organic acid, a quencher, or a combination thereof.

The surfactant may include for example an alkyl benzene sulfonate salt, an alkyl pyridinium salt, polyethylene glycol, a quaternary ammonium salt, or a combination thereof, but is not limited thereto.

The crosslinking agent may be for example a melamine-based crosslinking agent, a substituted urea-based crosslinking agent, an acryl-based crosslinking agent, an epoxy-based crosslinking agent, and/or a polymer-based crosslinking agent, but is not limited thereto. It may be a crosslinking agent having at least two crosslinking forming substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trimethylpropane triglycidyl ether, 1,3-bis(glycidoxypropyl)tetramethyldisiloxane, methoxymethylated urea, butoxymethylated urea, methoxymethylated thiourea, and/or the like.

The leveling agent may be used for improving coating flatness during printing and may be any suitable, commercially available leveling agent.

The organic acid may include p-toluenesulfonic acid, benzenesulfonic acid, p-dodecylbenzenesulfonic acid, 1,4-naphthalenedisulfonic acid, methanesulfonic acid, a fluorinated sulfonium salt, malonic acid, citric acid, propionic acid, methacrylic acid, oxalic acid, lactic acid, glycolic acid, succinic acid, or a combination thereof, but is not limited thereto.

The quencher may be diphenyl (p-tolyl) amine, methyl diphenyl amine, triphenyl amine, phenylenediamine, naphthylamine, diaminonaphthalene, or a combination thereof.

In some embodiments, an acid compound different from the compound represented by Chemical Formula 1 may be additionally mixed together with the semiconductor photoresist composition of the present disclosure.

A use amount of the additives may be controlled depending on suitable or desired properties.

In embodiments, the semiconductor photoresist composition may further include a silane coupling agent as an adherence enhancer in order to improve a close-contacting force with the substrate (e.g., in order to improve adherence of the semiconductor photoresist composition to the substrate). The silane coupling agent may be for example a silane compound including a carbon-carbon unsaturated bond such as vinyltrimethoxysilane, vinyl triethoxysilane, vinyl trichlorosilane, vinyl tris(β-methoxyethoxy)silane; and/or 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl]silane, and/or the like, but is not limited thereto.

The semiconductor photoresist composition may be formed into a pattern having a high aspect ratio without a collapse. Accordingly, in order to form a fine pattern having a width of, for example, about 5 nm to about 100 nm, for example, about 5 nm to about 80 nm, for example, about 5 nm to about 70 nm, for example, about 5 nm to about 50 nm, for example, about 5 nm to about 40 nm, for example, about 5 nm to about 30 nm, or for example, about 5 nm to about 20 nm, the semiconductor photoresist composition may be used for a photoresist process using light in a wavelength range from about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to some embodiments may be used to realize extreme ultraviolet lithography using an EUV light source having a wavelength of about 13.5 nm.

According to according to some embodiments, a method of forming patterns using the aforementioned semiconductor photoresist composition is provided. For example, the manufactured pattern may be a photoresist pattern.

The method of forming patterns according to some embodiments includes providing an etching-objective layer on a substrate, coating the semiconductor photoresist composition on the etching-objective layer to form a photoresist layer, patterning the photoresist layer to form a photoresist pattern, and etching the etching-objective layer using the photoresist pattern as an etching mask.

Hereinafter, a method of forming patterns using the semiconductor photoresist composition is described referring to FIGS. 1A-1E. FIGS. 1A-1E are cross-sectional views illustrating a method of forming patterns using a semiconductor photoresist composition according to some embodiments.

Referring to FIG. 1A, an object for etching is prepared. The object for etching may be a thin film 102 on a semiconductor substrate 100. Hereinafter, the object for etching is limited to the thin film 102. A surface of the thin film 102 is washed to remove impurities and/or the like remaining thereon. The thin film 102 may be for example a silicon nitride layer, a polysilicon layer, and/or a silicon oxide layer.

Subsequently, the resist underlayer composition for forming a resist underlayer 104 is spin-coated on the surface of the washed thin film 102. However, the embodiments are not limited thereto, and various suitable coating methods, for example a spray coating, a dip coating, a knife edge coating, a printing method, for example an inkjet printing and/or a screen printing, and/or the like may be used.

The coating process of the resist underlayer may be omitted, and hereinafter, a process including a coating of the resist underlayer is described.

Then, the coated composition is dried and baked to form a resist underlayer 104 on the thin film 102. The baking may be performed at about 100° C. to about 500° C., for example, about 100° C. to about 300° C.

The resist underlayer 104 is formed between the substrate 100 and a photoresist layer 106 and thus may prevent or reduce non-uniformity and reduction of pattern formability of a photoresist line width that would otherwise result if a ray reflected from on the interface between the substrate 100 and the photoresist layer 106 and/or a hardmask between layers is scattered into an unintended photoresist region.

Figure 1B:
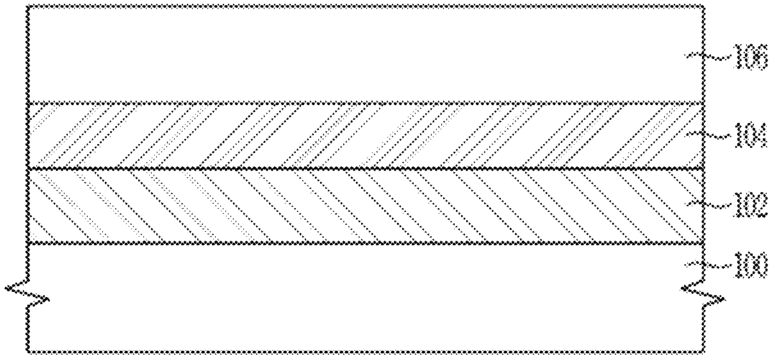

Referring to FIG. 1B, the photoresist layer 106 is formed by coating the semiconductor photoresist composition on the resist underlayer 104. The photoresist layer 106 is obtained by coating the aforementioned semiconductor photoresist composition on the thin film 102 formed on the substrate 100 and then, curing it through a heat treatment.

In embodiments, the formation of a pattern by using the semiconductor photoresist composition may include coating the semiconductor resist composition on the substrate 100 having the thin film 102 through spin coating, slit coating, inkjet printing, and/or the like and then, drying it to form the photoresist layer 106.

The semiconductor photoresist composition has already been illustrated in detail and description thereof may not be repeated below.

Subsequently, a substrate 100 having the photoresist layer 106 is subjected to a first baking process. The first baking process may be performed at about 80° C. to about 120° C.

Figure 1C:
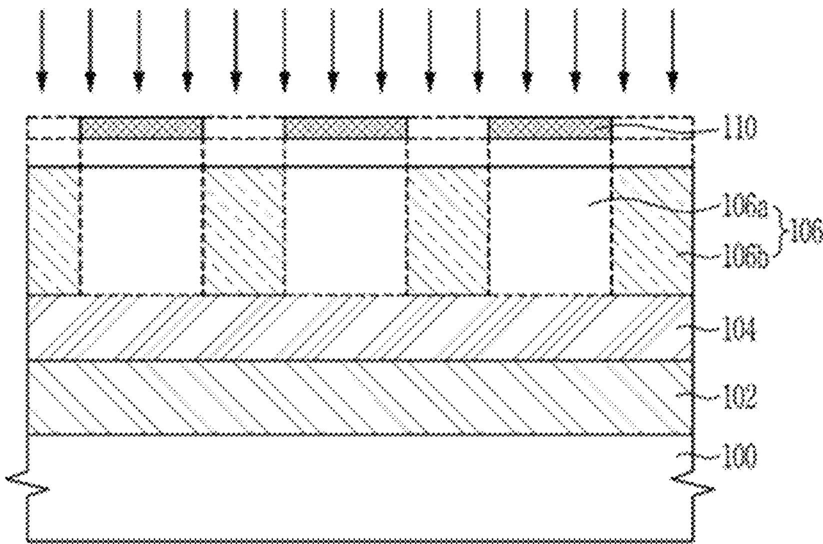

Referring to FIG. 1C, the photoresist layer 106 may be selectively exposed using a patterned mask 110.

For example, the exposure may use an activation radiation including light having a high energy wavelength such as EUV (extreme ultraviolet; a wavelength of about 13.5 nm), an E-Beam (an electron beam), and/or the like as well as a short wavelength such as an i-line (a wavelength of about 365 nm), a KrF excimer laser (a wavelength of about 248 nm), an ArF excimer laser (a wavelength of about 193 nm), and/or the like.

In embodiments, light for the exposure according to some embodiments may have a short wavelength in a range from about 5 nm to about 150 nm and a high energy wavelength, for example, EUV (extreme ultraviolet; a wavelength of 13.5 nm), an E-Beam (an electron beam), and/or the like.

The exposed region 106*b* of the photoresist layer 106 has a different solubility from the unexposed region 106*a* of the photoresist layer 106 by forming a polymer by a crosslinking reaction such as condensation reaction between organometallic compounds.

Subsequently, the substrate 100 is subjected to a second baking process. The second baking process may be performed at a temperature of about 90° C. to about 200° C. The exposed region 106*b* of the photoresist layer 106 becomes easily indissoluble with respect to a developer due to the second baking process.

Figure 1D:
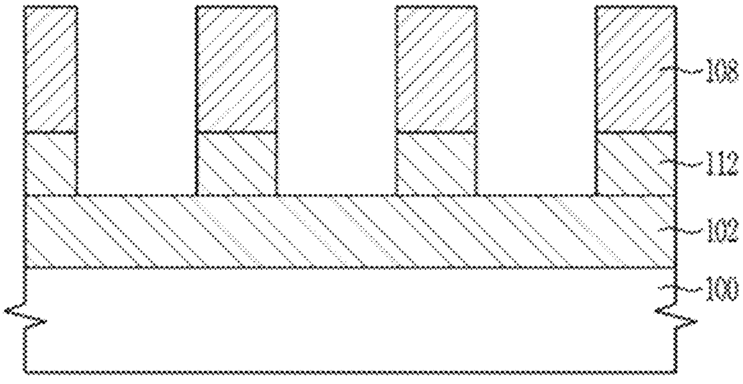

In FIG. 1D, the unexposed region 106*a* of the photoresist layer is dissolved and removed using the developer to form a photoresist pattern 108. In embodiments, the unexposed region 106*a* of the photoresist layer is dissolved and removed by using an organic solvent such as 2-heptanone and/or the like to complete the photoresist pattern 108 corresponding to the negative tone image.

As described above, a developer used in a method of forming patterns according to some embodiments may be an organic solvent. The organic solvent used in the method of forming patterns according to some embodiments may be for example ketones such as methylethylketone, acetone, cyclohexanone, 2-heptanone, and/or the like, alcohols such as 4-methyl-2-propanol, 1-butanol, isopropanol, 1-propanol, methanol, and/or the like, esters such as propylene glycol monomethyl ether acetate, ethyl acetate, ethyl lactate, n-butyl acetate, butyrolactone, and/or the like, aromatic compounds such as benzene, xylene, toluene, and/or the like, or a combination thereof.

However, the photoresist pattern according to some embodiments is not necessarily limited to the negative tone image but may be formed to have a positive tone image. In embodiments, a developer used for forming the positive tone image may be a quaternary ammonium hydroxide composition such as tetraethylammonium hydroxide, tetrapropylammonium hydroxide, tetrabutylammonium hydroxide, or a combination thereof.

As described above, exposure to light having a high energy such as EUV (extreme ultraViolet; a wavelength of 13.5 nm), an E-Beam (an electron beam), and/or the like as well as light having a wavelength such as i-line (wavelength of about 365 nm), KrF excimer laser (wavelength of about 248 nm), ArF excimer laser (wavelength of about 193 nm), and/or the like may provide a photoresist pattern 108 having a width of a thickness of about 5 nm to about 100 nm. For example, the photoresist pattern 108 may have a width of a thickness of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm.

In embodiments, the photoresist pattern 108 may have a pitch of having a half-pitch of less than or equal to about 50 nm, for example less than or equal to about 40 nm, for example less than or equal to about 30 nm, for example less than or equal to about 20 nm, or for example less than or equal to about 15 nm, and a line width roughness of less than or equal to about 10 nm, or less than or equal to about 5 nm, less than or equal to about 3 nm, or less than or equal to about 2 nm.

In embodiments, the photoresist pattern 108 is used as an etching mask to etch the resist underlayer 104. Through this etching process, an organic layer pattern 112 is formed. The organic layer pattern 112 also may have a width corresponding to that of the photoresist pattern 108.

Figure 1E:
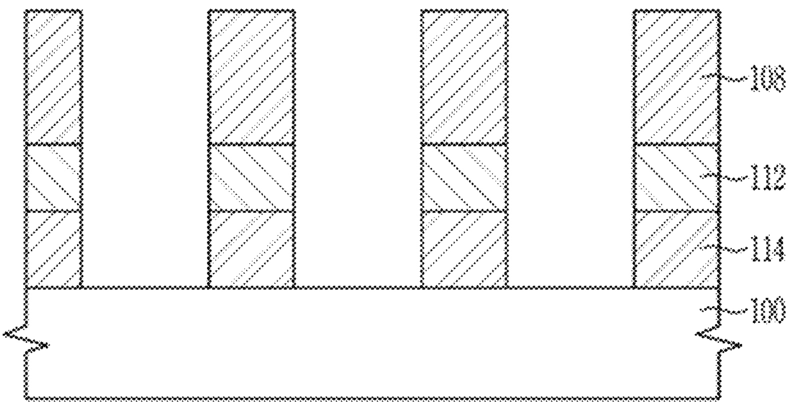

Referring to FIG. 1E, the exposed thin film 102 is etched by applying the photoresist pattern 108 as an etching mask. As a result, the thin film is formed as a thin film pattern 114.

The etching of the thin film 102 may be, for example, dry etching using an etching gas and the etching gas may be for example $CHF_3$, $CF_4$, $Cl_2$, $BCl_3$ and/or a mixed gas thereof.

In the exposure process, the thin film pattern 114 formed by using the photoresist pattern 108 formed through the exposure process performed by using an EUV light source may have a width corresponding to that of the photoresist pattern 108. For example, the thin film pattern 114 may have a width of about 5 nm to about 100 nm which is equal to that of the photoresist pattern 108. For example, the thin film pattern 114 formed by using the photoresist pattern 108 formed through the exposure process performed by using an EUV light source may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm, and more specifically a width of less than or equal to about 20 nm, like that of the photoresist pattern 108.

Hereinafter, embodiments of the present disclosure will be described in more detail through examples of the preparation of the aforementioned semiconductor photoresist composition. However, the present disclosure is technically not restricted by the following examples.

Synthesis of Organometallic Compound

Synthesis Example 1

40.7 g of t-butylSn$Ph_3$ and 300 g of propionic acid were added to a 250 ml 2-necked round-bottomed flask and then, refluxed by heating for 24 hours.

A compound represented by Chemical Formula 5 was obtained by removing the unreacted propionic acid under a reduced pressure therefrom.

Chemical Formula 5

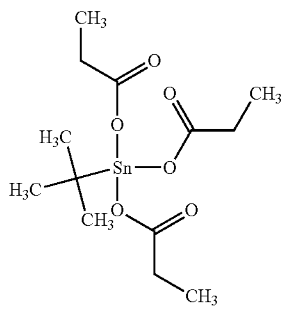

Synthesis Example 2

After adding 30 ml of anhydrous pentane to 10 g of t-AmylSn$Cl_3$ and maintaining their temperature at 0° C., 7.4 g of diethyl amine and 6.1 g of ethanol were added thereto and then, stirred at room temperature for 1 hour. When a reaction was completed, the resultant was filtered, concentrated, and vacuum-dried, obtaining a compound represented by Chemical Formula 6.

Chemical Formula 6

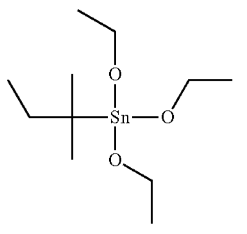

Synthesis Example 3

10 g of dibutyltin dichloride was dissolved 30 mL of ether, 70 mL of a 1 M sodium hydroxide (NaOH) aqueous solution was added thereto and then, stirred for 1 hour. After the stirring, a solid produced therein was filtered, three times washed with 25 mL of deionized water, and dried at 100° C. under a reduced pressure to obtain an organometallic compound represented by Chemical Formula 7 and having a weight average molecular weight of 1,500.

Chemical Formula 7

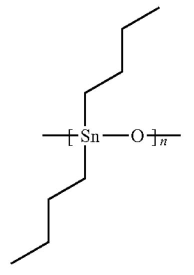

Preparation of Semiconductor Photoresist Composition

Examples 1 to 11 and Comparative Examples 1 to 6

The compounds represented by Chemical Formulas 5 to 7 according to Synthesis Examples 1 to 3 and the compounds represented by Chemical Formulas 8 to 10 or lactic acid were respectively dissolved in 4-methyl-2-pentanol at a concentration of 2 wt % in a weight ratio shown in Table 1 and then, filtered with a 0.1 μm PTFE (polytetrafluoroethylene) syringe filter to prepare semiconductor photoresist compositions.

Chemical Formula 8

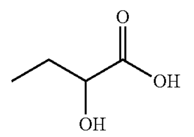

Chemical Formula 9

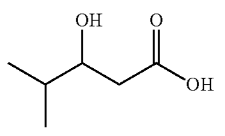

Chemical Formula 10

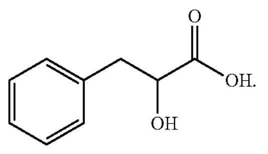

TABLE 1

| | Organometallic compound (wt %) | Carboxylic acid compound (wt %) |
|---|---|---|
| Example 1 | Chemical Formula 5 (2.95) | Chemical Formula 8 (0.05) |
| Example 2 | Chemical Formula 5 (2.95) | Chemical Formula 9 (0.05) |
| Example 3 | Chemical Formula 5 (2.90) | Chemical Formula 9 (0.10) |
| Example 4 | Chemical Formula 5 (2.85) | Chemical Formula 9 (0.15) |
| Example 5 | Chemical Formula 5 (2.90) | Chemical Formula 10 (0.10) |
| Example 6 | Chemical Formula 6 (2.90) | Chemical Formula 8 (0.10) |
| Example 7 | Chemical Formula 6 (2.90) | Chemical Formula 9 (0.10) |
| Example 8 | Chemical Formula 6 (2.90) | Chemical Formula 10 (0.10) |
| Example 9 | Chemical Formula 7 (2.90) | Chemical Formula 8 (0.10) |
| Example 10 | Chemical Formula 7 (2.90) | Chemical Formula 9 (0.10) |
| Example 11 | Chemical Formula 7 (2.90) | Chemical Formula 10 (0.10) |
| Comparative Example 1 | Chemical Formula 5 (3.00) | — |
| Comparative Example 2 | Chemical Formula 6 (3.00) | — |

TABLE 1-continued

| | Organometallic compound (wt %) | Carboxylic acid compound (wt %) |
|---|---|---|
| Comparative Example 3 | Chemical Formula 7 (3.00) | — |
| Comparative Example 4 | Chemical Formula 5 (2.90) | lactic acid (0.10) |
| Comparative Example 5 | Chemical Formula 6 (2.90) | lactic acid (0.10) |
| Comparative Example 6 | Chemical Formula 7 (2.90) | lactic acid (0.10) |

Evaluation: Evaluation of Sensitivity, Line Edge Roughness (LER) and Exposure Latitude (EL)

Each of the photoresist compositions according to the examples and the comparative examples was spin-coated at 1500 rpm for 30 seconds on a 200 mm circular silicon wafer of which the surface was deposited with HMDS, baked at 100° C. for 60 seconds (post-apply baked (PAB)), and then, allowed to stand at room temperature (23±2° C.) for 30 seconds.

Subsequently, a linear array of 50 circular pads each having a diameter of 500 μm was projected onto the wafer coated with each of the photoresist compositions by using EUV light (Lawrence Berkeley National Laboratory Micro Exposure Tool, MET). Herein, pad exposure time was adjusted to ensure that the EUV light in an increased dose was applied to each pad.

Then, the resist and the substrate were baked at 160° C. for 120 seconds on a hot plate after the exposure. The baked film was developed in a propylene glycol methyl ether acetate (PGMEA) solvent to form a negative tone image. Finally, the obtained film was baked again at 150° C. for 2 minutes on the hot plate, thereby completing the process.

Critical dimension-scanning electron microscopy (CD-SEM) was used to measure resist line widths to exposed dose (energy) changes. The resist line widths differently formed according to each exposed dose were used to confirm appropriate sensitivity to each exposure dose and thus calculate EL (Exposure Latitude) according to Equation 1. In addition, after measuring LER from the CD-SEM image, sensitivity, EL, and line edge roughness were evaluated according to the following criteria, and the results are shown in Table 2.

$$^{*}EL = (E_{+10\%} - E_{-10\%})/Eop \times 100\% \quad \text{Equation 1}$$

(Eop: optimum exposure dose of target CD, $E_{+10\%}$, $E_{-10\%}$: error range (±10%) of exposure dose of target CD)

Evaluation Criteria of Sensitivity

A: less than 16 $mJ/cm^2$

B: greater than or equal to 16 $mJ/cm^2$ and less than or equal to 18 $mJ/cm^2$

C: greater than 18 $mJ/cm^2$

Evaluation Criteria of LER

○: less than or equal to 3 nm

Δ: greater than 3 nm and less than or equal to 6 nm

X: greater than 6 nm

Evaluation Criteria of EL

A: greater than or equal to 20%

B: greater than or equal to 10% and less than 20%

C: greater than or equal to 5% and less than 10%

D: less than or equal to 5%

TABLE 2

| | Sensitivity | LER | EL |
|---|---|---|---|
| Example 1 | B | ○ | B |
| Example 2 | B | ○ | A |
| Example 3 | B | ○ | B |
| Example 4 | B | ○ | B |
| Example 5 | B | ○ | C |
| Example 6 | A | Δ | A |
| Example 7 | A | Δ | C |
| Example 8 | A | Δ | B |
| Example 9 | B | ○ | B |
| Example 10 | B | ○ | B |
| Example 11 | B | ○ | B |
| Comparative Example 1 | C | Δ | C |
| Comparative Example 2 | B | X | D |
| Comparative Example 3 | C | Δ | C |
| Comparative Example 4 | B | X | C |
| Comparative Example 5 | C | X | D |
| Comparative Example 6 | B | X | C |

Referring to the results of Table 2, the patterns formed by respectively using the semiconductor photoresist compositions according to Examples 1 to 11 exhibited excellent sensitivity and LER and/or EL characteristics, compared with those formed by respectively using the semiconductor photoresist compositions according to Comparative Examples 1 to 6.

Hereinbefore, certain embodiments have been described and illustrated, however, it should be apparent to a person having ordinary skill in the art that the present disclosure is not limited to the embodiments as described, and may be variously modified and transformed without departing from the spirit and scope of the present disclosure. Accordingly, the modified or transformed embodiments as such may not be understood separately from the technical ideas and aspects of the present disclosure, and the modified embodiments are within the scope of the appended claims, and equivalents thereof.

| Description of Symbols | | | |
|---|---|---|---|
| 100: | substrate | 102: | thin film |
| 104: | resist underlayer | 106: | photoresist layer |
| 106a: | unexposed region | 106b: | exposed region |
| 108: | photoresist pattern | 110: | patterned mask |
| 112: | organic layer pattern | 114: | thin film pattern |

What is claimed is:

1. A semiconductor photoresist composition, comprising:

a tin (Sn)-containing organometallic compound represented by Chemical Formula 2;

a compound represented by Chemical Formula 1; and a solvent:

Chemical Formula 1

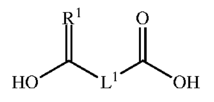

wherein, in Chemical Formula 1, $L^1$ is a single bond or a substituted or unsubstituted C1 to C10 alkylene group, and $R^1$ is a substituted or unsubstituted C2 to C20 alkyl group, a substituted or unsubstituted C3 to C20 cycloalkyl group, a substituted or unsubstituted C2 to C20alkenyl group, a substituted or unsubstituted C2 to C20 alkynyl group, a substituted or unsubstituted C6 to C30 aryl group, a substituted or unsubstituted C7 to C30 arylalkyl group, $-L^a-X^1-R^a$, wherein $X^1$ is O or S, $L^a$ is a single bond or a substituted or unsubstituted C1 to C20 alkylene group, and $R^a$ is a substituted or unsubstituted C1 to C20 alkyl group or a substituted or unsubstituted C6 to C30 aryl group, or $-L^b-N(R^b)(R^c)$, wherein, $L^b$ is a single bond or a substituted or unsubstituted C1 to C20 alkylene group, and $R^b$ and $R^c$ are each independently hydrogen or a substituted or unsubstituted C1 to C20 alkyl group;

Chemical Formula 2

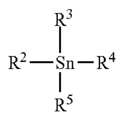

wherein, in Chemical Formula 2, $R^2$ is selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, and a substituted or unsubstituted C7 to C30 arylalkyl group, $R^3$ to $R^5$ are each independently alkoxy and aryloxy $-OR^d$, wherein $R^d$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

2. The semiconductor photoresist composition as claimed in claim 1, wherein:

$R^1$ is an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, or a propoxy group.

3. The semiconductor photoresist composition as claimed in claim 1, wherein:

the compound represented by Chemical Formula 1 is one selected from the compounds listed in Group 1:

Chemical Formula 8

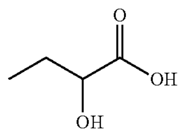

Chemical Formula 9

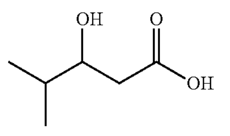

-continued

Chemical Formula 10

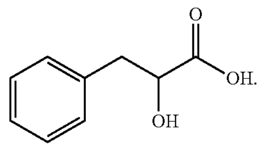

4. The semiconductor photoresist composition as claimed in claim 1, wherein:

the compound represented by Chemical Formula 1 is included in an amount of about 0.01 wt % to about 10 wt % based on 100 wt % of the semiconductor photoresist composition.

5. The semiconductor photoresist composition as claimed in claim 1, wherein:

the compound represented by Chemical Formula 1 is included in an amount of about 0.5 wt % to about 5 wt % based on 100 wt % of the semiconductor photoresist composition.

6. The semiconductor photoresist composition as claimed in claim 1, wherein:

the Sn-containing organometallic compound is included in an amount of about 0.5 wt % to about 30 wt % based on 100 wt % of the semiconductor photoresist composition.

7. The semiconductor photoresist composition as claimed in claim 1, wherein:

the Sn-containing organometallic compound and the compound represented by Chemical Formula 1 are included in a weight ratio of about 99.9:0.1 to about 80:20.

8. The semiconductor photoresist composition as claimed in claim 1, wherein:

the semiconductor photoresist composition further comprises an additive of a surfactant, a crosslinking agent, a leveling agent, an organic acid, a quencher, or a combination thereof.

9. The semiconductor photoresist composition as claimed in claim 1, wherein:

$R^2$ is a substituted or unsubstituted C1 to C8 alkyl group, a substituted or unsubstituted C3 to C8 cycloalkyl group, a substituted or unsubstituted C2 to C8 aliphatic unsaturated organic group including one or more double bonds and/or triple bonds, a substituted or unsubstituted C6 to C20 aryl group, a substituted or unsubstituted C4 to C20 heteroaryl group, a carbonyl group, an ethoxy group, a propoxy group, or a combination thereof, and $R^d$ is a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof.

10. A method of forming patterns, comprising:

providing an etching-objective layer on a substrate;

coating the semiconductor photoresist composition as claimed in claim 1 on the etching-objective layer to form a photoresist layer;

patterning the photoresist layer to form a photoresist pattern; and etching the etching-objective layer using the photoresist pattern as an etching mask.

* * * * *